US005983087A

United States Patent [19]

[11] Patent Number: 5,983,087
[45] Date of Patent: Nov. 9, 1999

Milne et al.

[54] DISTRIBUTED DIGITAL SIGNAL PROCESSING FOR VEHICLE AUDIO SYSTEMS

[75] Inventors: James R. Milne; Tuan A. Hoang; Mathew Alan Boytim, all of Kokomo, Ind.; J. Alexander Easley, Warren, Mich.; Michael Thomas Augustyn, Kokomo, Ind.; Thomas Stein, Kleinmaischeid, Germany

[73] Assignee: Delco Electronics Corporation, Kokomo, Ind.

[21] Appl. No.: 08/882,766

[22] Filed: Jun. 26, 1997

[51] Int. Cl.[6] .............................. H04R 1/20; H03G 9/00

[52] U.S. Cl. .............................. 455/149; 381/1; 381/18; 381/103

[58] Field of Search .............................. 455/149; 381/1, 381/18, 103, 26, 63, 86, 85, 82, 81, 77, 105; 296/214

[56] References Cited

U.S. PATENT DOCUMENTS

| | | | |
|---|---|---|---|
| 5,381,482 | 1/1995 | Matsumoto et al. | 381/18 |
| 5,420,929 | 5/1995 | Geddes et al. | 381/1 |
| 5,548,650 | 8/1996 | Clark | 381/55 |
| 5,581,621 | 12/1996 | Koyama et al. | 381/103 |
| 5,657,391 | 8/1997 | Jyosako | 381/1 |
| 5,754,664 | 5/1998 | Clark et al. | 381/86 |

*Primary Examiner*—Dwayne D. Bost
*Assistant Examiner*—Alan T. Gantt
*Attorney, Agent, or Firm*—Jimmy L Funke

[57] ABSTRACT

A radio with a tuner and other program sources uses a digital signal processor (DSP) to enhance the audio signal and to generate a stream of digital data including audio data and control data corresponding to loudness functions. A fiber optic data link couples the data stream to a plurality of remote DSP modules each of which drive one or more speakers. Each module contains a user programmed DSP, a digital to analog converter and an amplifier for each associated speaker. The DSP modules are identical except for software parameters which establish a transfer function and a loudness characteristic for each speaker. The same DSP modules and the same speakers can be used in several vehicle types and the system audio performance can be optimized by customizing software for each type of vehicle.

5 Claims, 3 Drawing Sheets

FIG - 3
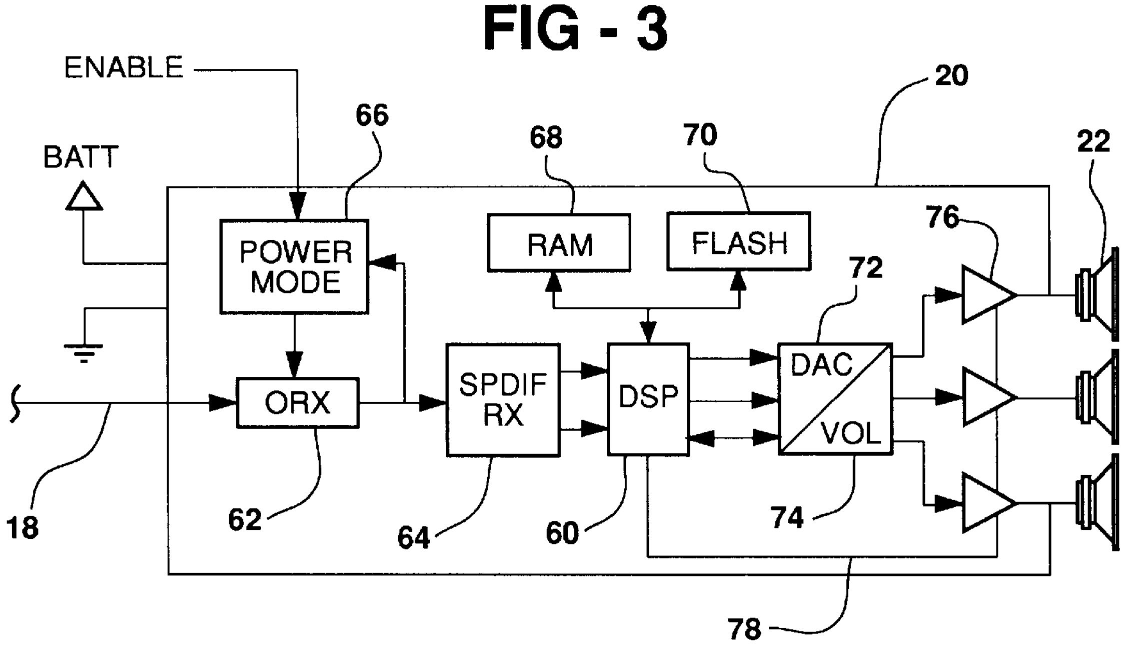
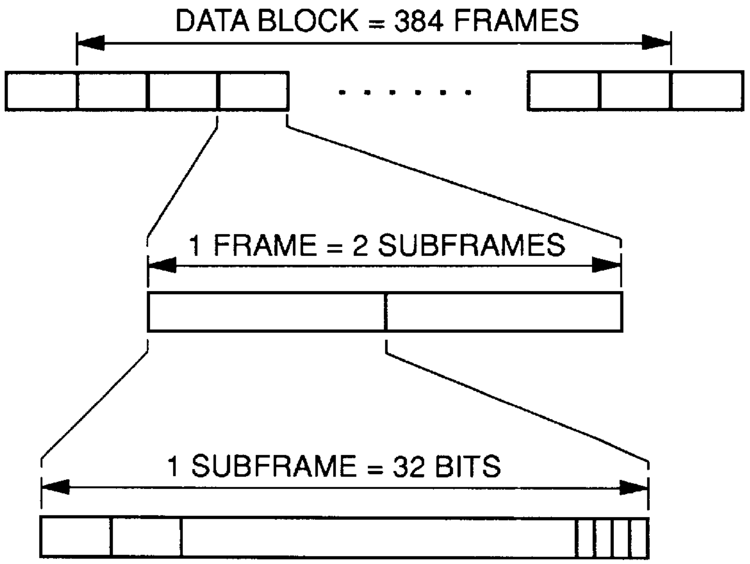
FIG - 4

DISTRIBUTED DIGITAL SIGNAL PROCESSING FOR VEHICLE AUDIO SYSTEMS

FIELD OF THE INVENTION

This invention relates to vehicle audio systems and particularly to distributed digital signal processing for customizing audio systems.

BACKGROUND OF THE INVENTION

In the design of radio or audio systems for automotive vehicles, performance is optimized by selecting speaker characteristics, speaker placement, filters for cross-over control and other custom hardware for each type of vehicle. Variations in vehicles of a similar type such as the presence of a sun roof or leather seats affects the acoustical properties of the vehicle and the system must be altered accordingly if optimum sound is to be attained. Given that there are different levels of systems from a basic 4 speaker system to an 18 speaker system, even more equipment variables have to be entertained. This poses an expensive design effort for each type of vehicle and further requires an inventory of parts especially selected or made for various types of vehicles.

The basic unit of a vehicle audio system is a radio augmented by other program sources such as a cassette tape player and/or a compact disc (CD) changer or player which are processed by a portion of the radio circuits. With the use of digital technology in sound systems, a digital signal processor (DSP) in the radio processes the incoming audio signal to achieve bass and treble control and room effect simulations, and outputs audio signals to the speakers which are distributed throughout the vehicle.

It is here proposed to use the DSP technology to reduce the proliferation of parts and further to simplify vehicle assembly through the use of common wiring and reduced part numbers, improved heat management, optimized audio performance, and system upgradability.

SUMMARY OF THE INVENTION

It is therefore an object of the invention to customize a vehicle sound system for optimum performance using standardized hardware. It is another object in such a system to reduce part proliferation.

An audio system has a central DSP as part of the radio or separate from the radio and a plurality of remote DSP modules each near a speaker and connected to the central DSP by a digital bus such as a fiber optic link. The central DSP outputs audio signals which include a stream of audio data as well as a stream of control data. The central DSP performs audio processing functions which are common to all channels, such as room effect simulations, as well as implementing the bus gateway functions related to multiplexing the control data stream onto the audio data stream.

The remote DSP modules are identical and include a DSP, nonvolatile memory, random access memory (RAM), a digital to analog converter (DAC) and an amplifier for each speaker. A software controlled gain stage and a transfer function for each speaker permits adjustment of individual speaker response for a given vehicle. A library of audio system data for the gain and transfer functions is established in a host computer for a variety of vehicle types and used to program each system. Upon vehicle assembly, the equalization coefficients, loudness coefficients, and speaker gains needed to optimize the audio performance in that vehicle are downloaded from the host via the central DSP to each remote DSP module and stored in memory to thereby customize each speaker.

In operation, analog signals from an audio source is digitized and processed by the central DSP and combined with loudness related parameters such as volume, fade and balance. The DSP issues audio data along with control data in a data stream to the remote DSP modules via the data link. The audio data is processed according to the stored transfer functions and the control data, converted to an analog signal and amplified for each speaker.

BRIEF DESCRIPTION OF THE DRAWINGS

The above and other advantages of the invention will become more apparent from the following description taken in conjunction with the accompanying drawings wherein like references refer to like parts and wherein:

FIG. 3 is a block diagram of a remote DSP module according to the invention; and FIG. 4 is a diagram of the protocol for data structure employed in the system of FIG. 1.

DESCRIPTION OF THE INVENTION

Figure 1:
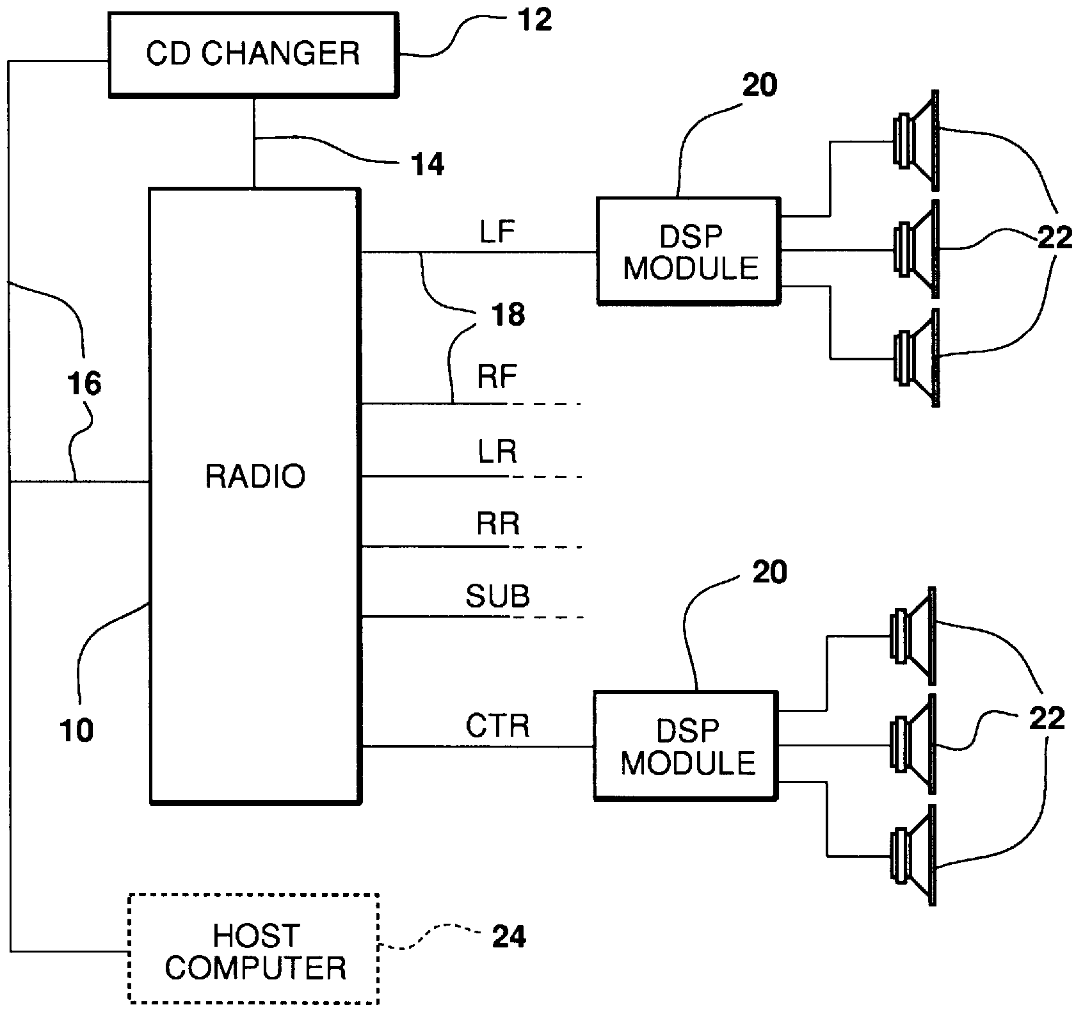
FIG. 1 is a block diagram of a vehicle audio system according to the invention.

Referring to FIG. 1, an audio system is centered around a radio 10 which provides tuner functions, cassette playback functions, and controls for a remote CD changer 12. Audio data from the CD changer is transmitted to the radio via a fiber optics data link 14. Control of the CD changer 12 is performed by a bi-directional serial data bus 16. Digital data buses 18 carry digital audio signals from the radio to several remote DSP modules 20. The modules 20 serve left front (LF), right front (RF), left rear (LR), right rear (RR), subwoofer (SUB) and center (CTR) speakers 22. Each remote DSP module 20 is connected to up to three speakers each located near the module. Where three speakers per module are employed, each set of speakers (except for the subwoofer case) comprises a tweeter, a midrange speaker and a woofer. The modules 20 are all identical but are programmed differently to achieve optimum system performance. The programming occurs at the time of vehicle assembly or when a system is updated, and is implemented by a host computer 24 which is coupled by the serial bus 16 to the radio module.

Figure 2:
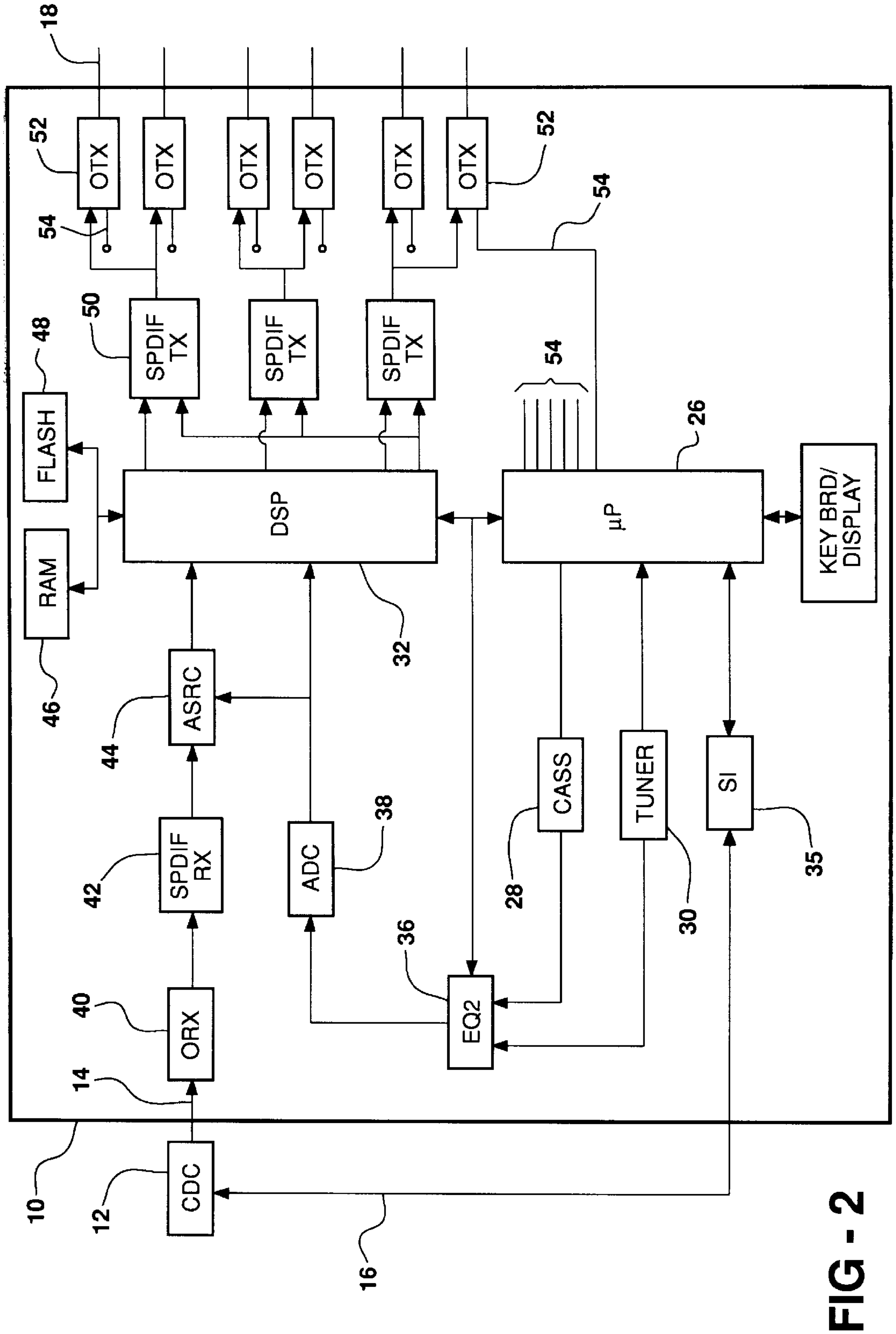
FIG. 2 is a block diagram of a radio module of an audio system according to the invention.

Referring to FIG. 2, the chief components of the radio 10 are a microprocessor 26, a cassette player 28 and a tuner 30 controlled by the microprocessor, and a central DSP 32. A keyboard and display module 34 is coupled to the microprocessor by a serial link; the module 34 contains the display, pushbuttons and other controls normally associated with a vehicle radio. The serial data bus 16 for controlling the CD changer 12 and for coupling to the host computer is connected to a microprocessor port through a serial interface (SI) 35. Analog audio outputs from the cassette player 28 and the tuner 30 are fed to a switch EQ2 (2 band equalizer chip) 36 to select one of the sources. An analog CD player, if used instead of the changer 12, could also be selected. The switch output is coupled through an ADC (analog to digital converter) 38 to the central DSP 32. The CD changer 12 has a digital output and is also connected to the DSP 32 via the fiber optic data link 14, an optical receiver (ORX) 40, a SPDIF receiver (Sony-Philips digital interface format converter) 42 and an ASRC (asynchronous sample rate converter) 44 which converts the CD sample rate to 48 kHz. A RAM (random access memory) 46 and a nonvolatile memory 48 which may be an EEPROM (electrically erasable programmable read only memory) or a flash memory and linked to the DSP. Outputs of the DSP 32 comprise three channels of audio data each directed to a separate SPDIF transmitter 50 and control data which is directed to all three SPDIFs which multiplex the audio and control data. The three SPDIF transmitters 50 each is connected to two optical transmitters (OTX) 52 thus affording an output channel on each of six fiber optic data links 18 directed to the six remote DSP modules 20. Thus each SPDIF transmitter supplies a pair of remote modules with the same signal. The three pairs are LF and RF, LR and RR, and CTR and SUB. A control line 54 from the microprocessor 26 to each of the OTX units permits selective enabling of the six output channels.

A remote DSP module 20, shown in FIG. 3, contains a DSP 60 coupled to a fiber optic data link 18 through an ORX 62 and a SPDIF receiver 64. A power mode circuit 66, supplied by a vehicle battery, controls power to the ORX 62 and the SPDIF 64 to turn off power when the audio system is off and to turn on the power after the system is turned on to avoid inappropriate noise due to transients. A RAM 68 and a flash memory or other 70 nonvolatile memory are coupled to the DSP 60. The DSP output is changed to an analog signal by a DAC 72 which includes a volume attenuator 74. Three amplifiers 76 driven by the DAC 72 comprise the module output. The output supplies up to three speakers 22. A feedback line 78 from the amplifiers 76 to the DSP 60 affords dynamic distortion limiting.

The remote DSP modules are responsible for receiving the messages from the central DSP 32 and processing then as well as performing all functions which are channel specific, namely equalization and volume adjustment. The remote DSP is configured by software stored in the flash memory 70 and transferred to RAM 68 during system operation. The audio processing software provides up to 5 equalization or cross-over features per speaker in any configuration using Direct Form I biquad sections with the following transfer function:

$$H_{EQ}=(b_0+b_1z^{-1}+b_2z^{-2})/(1+a_1z^{-1}+a_2z^{-2})$$

where the "a" terms are feedback coefficients, the "b" terms are feed forward coefficients, and the "z" terms define delay times. Thus a set of many coefficients is required to customize an audio system. To accommodate three speakers, a subset of transfer function coefficients is stored in each DSP module, each subset having fifteen groups, each group containing five coefficients. Furthermore, each DSP module has a gain stage for each speaker so the individual speaker levels may be adjusted in software.

In addition, the audio processing software also performs a dynamic loudness function common to all speakers which provides low frequency boost inversely proportional to the volume level. The corresponding transfer function is $$H_{LOUD}=(b_0+b_1z^{-1})/(1+a_1z^{-1}).$$

Equalization coefficients, loudness coefficients, and speaker gains are downloaded during an initialization process. Simply by changing the coefficients, these digital filters produce virtually any desired acoustic response to accommodate a wide range of audio systems and vehicle interiors.

The audio system has two modes of operation: a programming mode and a normal mode. The normal mode is the default mode and provides the usual audio functions. The programming mode provides software initialization capability and is available only to the factory or authorized service providers.

When the hardware is first installed in a vehicle, it is completely generic. That is, all remote DSP modules are physically and electrically identical. Thus, the mounting location of any remote module is completely arbitrary. Once the hardware is installed, the system is ready for software initialization which requires the host computer 24 which may be a personal computer or some other programming system to control the programming operation via the serial communication channel 16. The optical transmitters 54 are individually enabled by sequential activation of the lines 54 by the microprocessor 26. When enabled each remote DSP module is activated and assigned a unique identification number (ID) as well as a common or global ID to which all modules respond. A remote DSP module will process a control message from the central DSP only if the target ID number matches its own or is the global ID. Thus these ID numbers allow the central DSP to send a control message to a specific remote module even though it will be received by all modules or to broadcast a global message affecting all modules. For example, only the LF and RF modules would respond to a fade rear command whereas all modules would react to a volume command.

With each remote DSP module having an identity, the acoustic customization can be performed. The coefficients for the equalization filters, crossover filters, and speaker gains described above are downloaded from the host computer. Messages containing the proper coefficients are addressed by the IDs to each remote DSP module where they are stored in the flash memory.

To facilitate production support of many different audio systems, it is envisioned that a library of vehicle profiles and their corresponding audio system parameters be stored in the host programming system in a look-up table. The table is assembled for each vehicle type by designing a set of coefficients, trying them in a vehicle of that type, and making empirical improvements until optimal performance is attained. As the vehicle comes down the assembly line, its configuration can be matched to one of the predetermined profiles, then the appropriate equalization coefficients, crossover coefficients, and gain coefficients can be downloaded to the central DSP module and then subsets of the data is sent to respective ones of the remote DSP modules over the fiber optic bus. Once all the initialization data has been transferred, all the coefficient data is flashed into non-volatile memory. Following the completion of the programming process, the system exits the programming mode.

In the normal mode of operation, audio and audio control data from the radio is exported to the central DSP 32. The DSP 32 has two primary functions: first, it is responsible for producing the various listening environment enhancements, which include driver optimization and a simulation of a concert hall, for example. Driver optimization compensates for the different path lengths from the speakers to the driver's listening position, resulting in a more balanced spatial presentation. The concert hall simulation provides the listener with the impression that he or she is listening to the program in a concert hall. The second primary function of the central DSP module is the relaying of the audio control information (volume, balance, fade, etc.) from the radio to the remote modules. The audio and audio control data are multiplexed into a single serial data stream which is transmitted to the remote DSP modules via the fiber optic link 18.

The serial data stream comprises a continuous series of data blocks. As shown in FIG. 4, each data block comprises 384 frames, each frame has two subframes (one each for right and left channels), and each subframe comprises 32 bits. The bits are defined as shown in the table below; the definitions are modifications to the AES/EBU professional bus standard.

| BIT(S) | DEFINITION |
|---|---|
| 0–3 | Preamble |
| 4–27 | Audio Data |
| 28 | Validity Flag |
| 29 | Control Message Data |
| 30 | Channel Status |
| 31 | Parity Bit |

Each control message is 48 bits long. However only one bit of a message is sent per frame: thus it takes 48 frames of data to send a complete message. With an audio sampling rate of 48 kHz, the control data achieves a throughput of 48 kilobits per second. This data rate can be doubled simply by transmitting one data bit per subframe as opposed to transmitting 1 bit per frame.

The control messages, unlike the channel status information, are transmitted asynchronously with respect to the data block, thereby simplifying the timing requirements to put a message on the bus. When no control data needs to be transmitted, the message bits are filled with zeros to indicate an idle condition. As a result, the start of a control message is flagged by a "1" followed by the 48 bits of the control message itself. Since the central DSP initiates all data transfers, there is no possibility of bus contention, consequently eliminating the need for an arbitration procedure.

Due to the transfer function programmed into the remote modules, each speaker will respond to the audio data in a manner which optimizes system audio performance even though the same remote modules and standardized speaker sets are used throughout the vehicle. Each speaker loudness will depend on the control data which reflects volume, balance and fade settings entered by the operator. Since pairs of the remote modules supplied by each of the three SPDIF transmitters 54, each module of the pair will have the same audio data which may be different from the audio data sent to the other pair of modules. The same control data, however, is sent to all the modules, although it may be addressed to one or some of the modules.

The embodiments of the invention in which an exclusive property or privilege is claimed are defined as follows:

1. A vehicle audio system for driving a plurality of remote speakers, comprising:

a central digital signal processing module for receiving an input digital audio signal, and generating digital output signals, each digital output signal comprising a continuous sequence of frames, each frame including an address field, an audio data field and a control data field; and a plurality of remote digital signal processing modules coupled to the remote speakers and connected to the central module by digital data links, each digital output signal of said central module being supplied to a pair of remote modules, each remote module responding to control data in a respective control data field only when the respective address field contains an address that matches an ID code assigned to such remote module.

2. The vehicle audio system of claim 1, wherein the central digital signal processing module includes:

a central digital signal processor for generating digital control data and digital audio data signals based on the input digital audio signal;

digital interface circuits for generating said digital output signals, each digital interface circuit receiving the digital control data and one of the digital audio data signals; and where the digital data links couple the digital interface circuits to respective pairs of remote modules.

3. The vehicle audio system of claim 1, wherein the control data field of each digital output signal frame contains only a portion of a complete control message, and control data contained in a plurality of successive frames is combined by the remote modules to form complete control messages.

4. A method of operation for a vehicle audio system having a central digital signal processing module, and a plurality of remote digital signal processing modules coupled to a plurality of remote speakers, comprising the steps of:

receiving an input digital audio signal in the central digital signal processing module, and generating digital output signals, each digital output signal comprising a continuous sequence of frames, each frame including an address field, an audio data field and a control data field;

transmitting each digital output signal generated by said central module to a pair of said remote digital signal processing modules, each remote module responding to control data in a respective control data field only when the respective address field contains an address that matches an ID code assigned to such remote module.

5. The method of operation of claim 4, wherein the control data field of each digital output signal frame contains only a portion of a complete control message, and the remote modules combine control data contained in a plurality of successive frames to form complete control messages.

* * * * *